(12) United States Patent
Meng

(10) Patent No.: US 10,917,094 B2
(45) Date of Patent: Feb. 9, 2021

(54) STRIPE BASED SELF-GATING FOR RETIMING PIPELINES

(71) Applicant: Advanced Micro Devices, Inc., Santa Clara, CA (US)

(72) Inventor: Qing Meng, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 37 days.

(21) Appl. No.: 16/445,945

(22) Filed: Jun. 19, 2019

(65) Prior Publication Data
US 2020/0381069 A1    Dec. 3, 2020

(30) Foreign Application Priority Data

May 31, 2019    (CN) .......................... 2019 1 0467712

(51) Int. Cl.
*H03K 19/00* (2006.01)
*G11C 19/28* (2006.01)
*G11C 19/38* (2006.01)

(52) U.S. Cl.
CPC ....... *H03K 19/0016* (2013.01); *G11C 19/287* (2013.01); *G11C 19/38* (2013.01); *Y02D 10/00* (2018.01)

(58) Field of Classification Search
CPC ....... G11C 19/28; G11C 19/287; G11C 19/38; H03K 19/0016; Y02D 10/00
See application file for complete search history.

(56) References Cited

U.S. PATENT DOCUMENTS

| | | |
|---|---|---|
| 6,181,180 B1 | 1/2001 | Chen et al. |
| 6,247,134 B1 | 6/2001 | Sproch et al. |
| 7,417,465 B2 | 8/2008 | Lundberg et al. |
| 7,861,192 B2 | 12/2010 | Chejara |

(Continued)

FOREIGN PATENT DOCUMENTS

WO    WO2009024540 A2    2/2009

OTHER PUBLICATIONS

International Search Report and Written Opinion in International Application No. PCT/US2020/035264, dated Sep. 16, 2020, 11 pages.

*Primary Examiner* — Patrick O Neill
(74) *Attorney, Agent, or Firm* — Kowert Hood Munyon Rankin and Goetzel PC; Rory D. Rankin

(57) ABSTRACT

Systems, apparatuses, and methods for implementing stripe-based self-gating and change detect signal propagation for retiming pipelines are disclosed. A circuit includes one or more stripes, with each stripe including a plurality of stages of registers, with each stage only receiving input signals from the preceding stage. For a given stripe, the first stage of registers are self-gated to reduce power consumption by only clocking a group of registers when any of their input signals change. The self-gating signals of the first stage of registers are combined together to create a change detect signal which is passed through a register and provided to a second stage of registers as a clock-enable signal. Accordingly, the second stage registers are only clocked when the change detect signal indicates a change will be forwarded from the first stage. This reduces power consumption for the second stage without causing the area increase associated with self-gating circuitry.

20 Claims, 9 Drawing Sheets

(56) References Cited

U.S. PATENT DOCUMENTS

| | | |
|---|---|---|
| 8,013,649 B2 | 9/2011 | Duncan |
| 8,436,647 B2 * | 5/2013 | Bailey .................. G06F 9/3869 |
| | | 326/40 |
| 8,736,308 B2 * | 5/2014 | Bailey ................ H03K 19/0013 |
| | | 326/93 |
| 8,850,371 B2 * | 9/2014 | Sprinkle ............ H03K 19/0016 |
| | | 716/103 |
| 9,966,958 B2 | 5/2018 | Bunce et al. |
| 10,331,196 B2 | 6/2019 | Schreiber |
| 2014/0082400 A1 | 3/2014 | Sprinkle |
| 2020/0081479 A1 * | 3/2020 | Kalyanam ............ H03L 7/0802 |

* cited by examiner

STRIPE BASED SELF-GATING FOR RETIMING PIPELINES

PRIORITY INFORMATION

This application claims benefit of priority to Chinese Application No. 201910467712.7, entitled "STRIPE BASED SELF-GATING FOR RETIMING PIPELINES", filed May 31, 2019, the entirety of which is incorporated herein by reference in its entirety.

BACKGROUND

Description of the Related Art

Computing systems often include control logic to perform customized operations that are infeasible or would be less efficient if performed by a main processor. One type of a device used for implementing control logic is an application specific integrated circuit (ASIC). For high frequency digital designs, pipelining is typically performed for the logic blocks of an ASIC design. Complex designs are difficult to design by manually coding each pipeline stage. Retiming is one technique for quickly and efficiently designing a complex pipeline. For low power purposes, clock gating can be implemented for each stage of retimed pipeline. But in a large retiming pipeline, each stage only has one clock gating cell to control many registers and not all registers will toggle at the same clock cycle.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems, apparatuses, and methods for stripe-based self-gating and change detect signal propagation for retiming pipelines are disclosed herein. In one implementation, a circuit includes one or more stripes, with each stripe including a plurality of stages, with each stage only receiving input signals generated by a preceding stage. For a given stripe, the first stage of registers are self-gated to reduce power consumption by only clocking a group of registers when their input signal change. The self-gating signals of the first stage of registers are combined together to create a change detect signal. The change detect signal is passed through a register and then provided to a second stage of registers as a clock-enable signal. This reduces the power consumption of the second stage of registers by only clocking these registers when the change detect signal indicates a change will be forwarded from the first stage. The reduction in power consumption is achieved for the second stage without the area increase associated with self-gating circuitry.

In one implementation, a netlist representation of a circuit design is generated, and then the netlist representation is provided to a design tool. The design tool includes any suitable combination of hardware and/or software. In one implementation, the design tool includes a script file with executable commands that are executable by one or more processors of a computing system. The netlist representation is analyzed by the script so as to partition the circuit design into a plurality of stripes, with each stripe being optimized to reduce power consumption. Each stripe of the circuit design includes a plurality of register stages, with each stage generating signals that are coupled to a subsequent stage. In one implementation, self-gating circuitry is added to the first register stage of a stripe, and then a change detect signal is generated from the self-gating signals of the first register stage. The change detect signal is coupled to the subsequent stages of the stripe to be used as a clock enable signal for the registers of these stages. The change detect signal allows power consumption to be reduced without requiring self-gating circuitry for the subsequent stages of the stripe.

Figure 1:
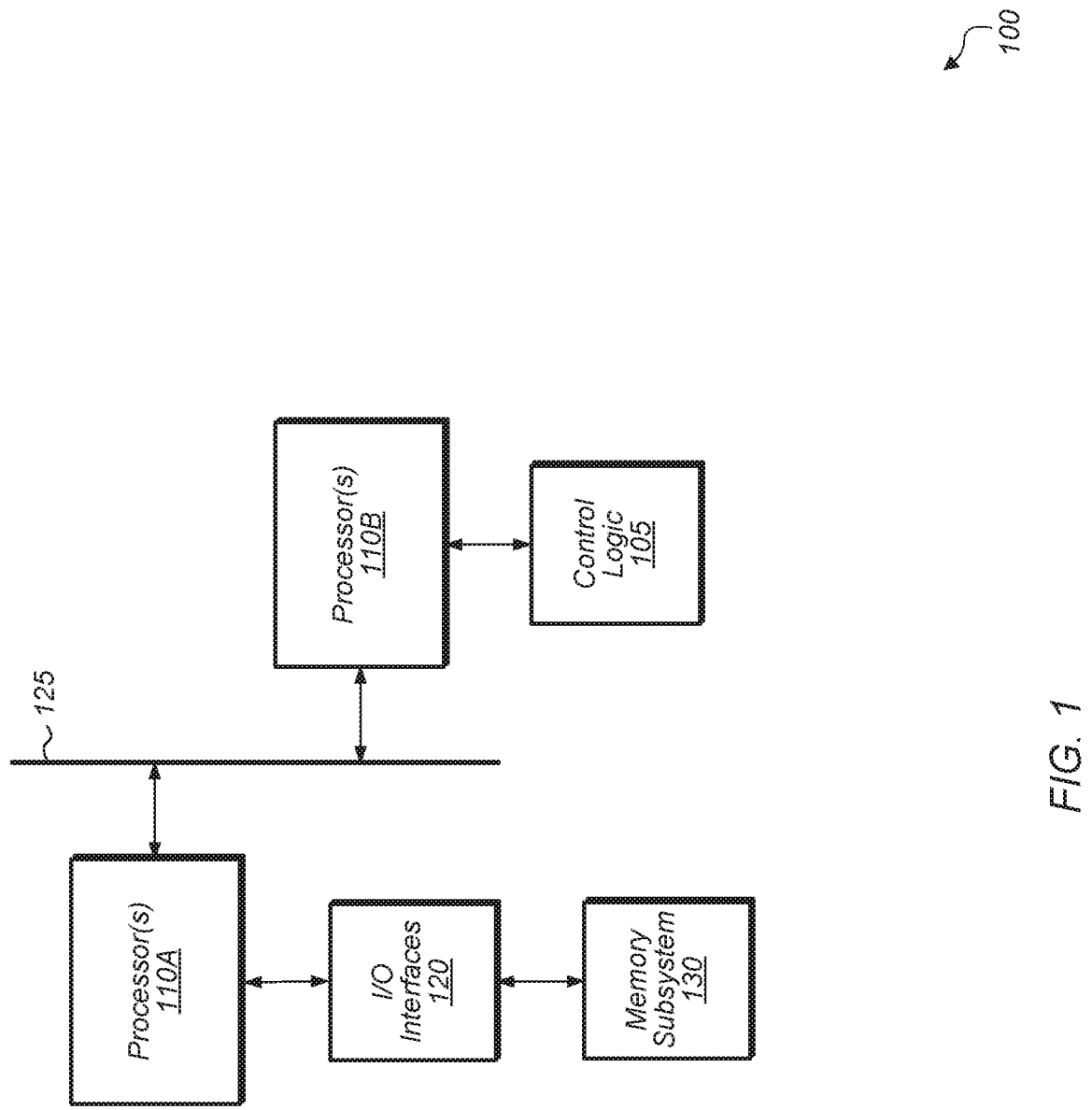
FIG. 1 is a block diagram of one implementation of a computing system.

Referring now to FIG. 1, a block diagram of one implementation of a computing system 100 is shown. In one implementation, computing system 100 includes at least control logic 105, processor(s) 110A-B, input/output (I/O) interfaces 120, bus 125, and memory subsystem 130. In other implementations, computing system 100 can include other components, computing system 100 can omit an illustrated component, and/or computing system 100 can be arranged differently. In one implementation, processor(s) 110B are coupled to control logic 105. In another implementation, control logic 105 is located within one or more of processor(s) 110B. Control logic 105 is representative of any combination of circuitry for implementing various algorithms or models (e.g., machine learning models, signal processing algorithms) or performing other functions for system 100. Control logic 105 can be used by any of a variety of different applications which vary according to the implementation.

Processors(s) 110A-B are representative of any number and type of processing units (e.g., central processing unit (CPU), graphics processing unit (GPU), digital signal processor (DSP), field programmable gate array (FPGA), application specific integrated circuit (ASIC)). Memory subsystem 130 includes any number and type of memory devices. For example, the type of memory in memory subsystem 130 can include high-bandwidth memory (HBM), non-volatile memory (NVM), Dynamic Random Access Memory (DRAM), Static Random Access Memory (SRAM), NAND Flash memory, NOR flash memory, Ferroelectric Random Access Memory (FeRAM), or others.

Memory subsystem 130 is accessible by computer vision accelerator engine 105 and processor(s) 110A-B. I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices can be coupled to I/O interfaces 120. Such peripheral devices include (but are not limited to) displays, keyboards, mice, printers, scanners, joysticks or other types of game controllers, media recording devices, external storage devices, network interface cards, and so forth.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components not shown in FIG. 1. Additionally, in other implementations, computing system 100 is structured in other ways than shown in FIG. 1.

Figure 2:
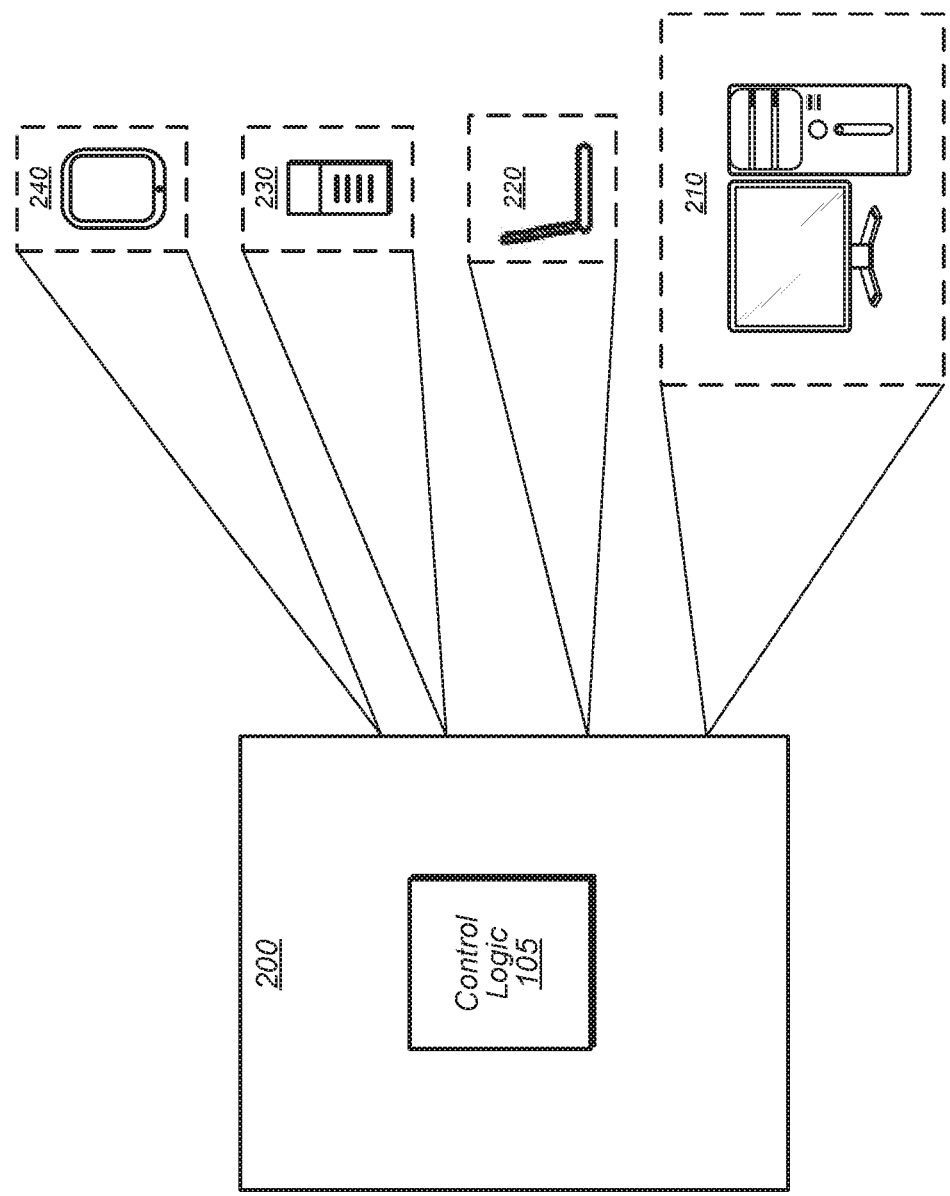
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes at least control logic 105 (of FIG. 1). Although not shown in FIG. 2, system 200 can also include any number and type of other components, such as one or more processors, one or more memory devices, and so on. Control logic 105 includes any number of change detect signals and propagation logic for performing clock-gating for various logic stages. More details regarding the change detect signals, propagation logic, and corresponding clock-gating will be provided throughout the remainder of this disclosure.

Figure 3:
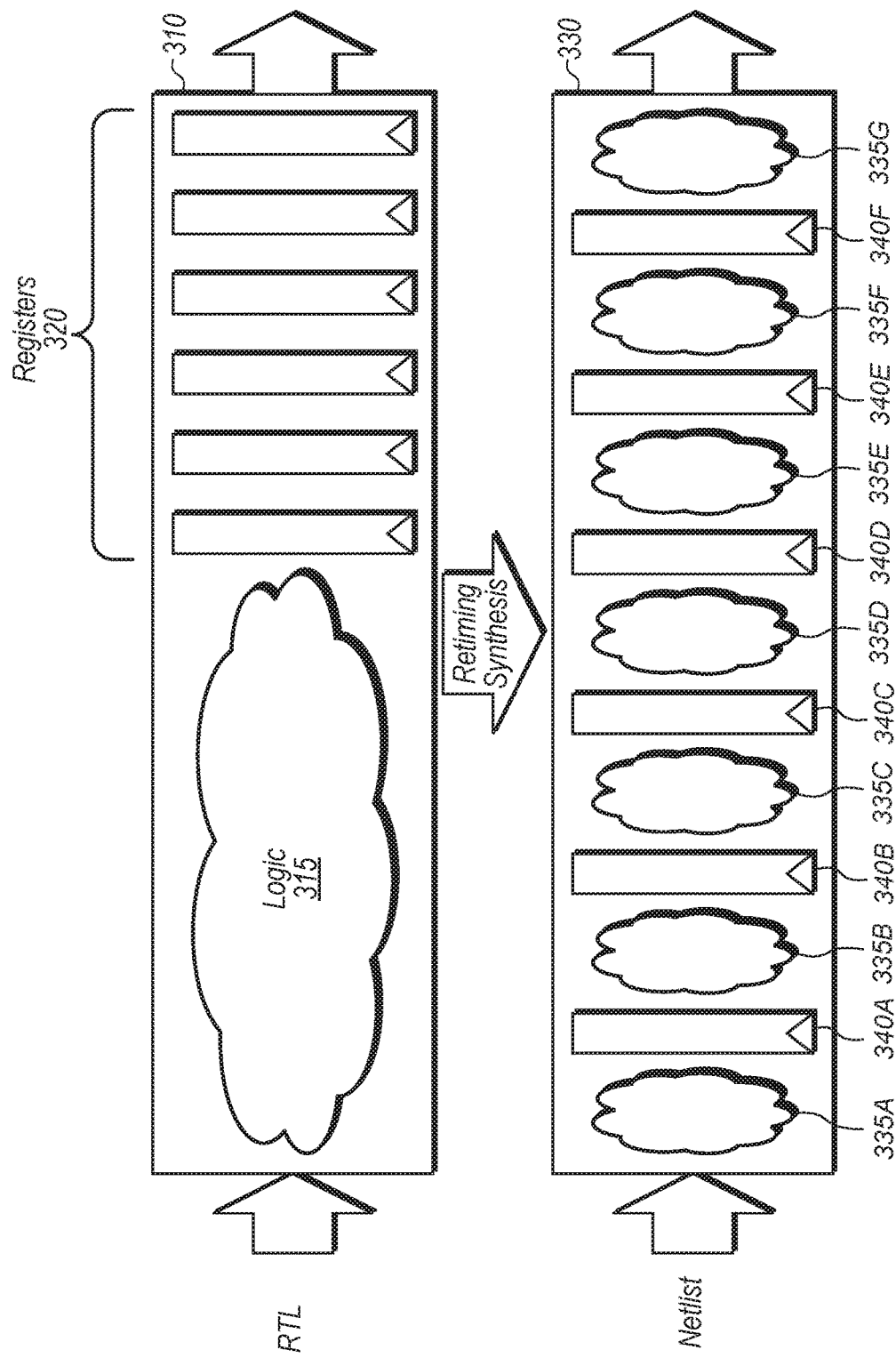
FIG. 3 is a block diagram of one implementation of performing a retiming synthesis on a logic design.

Referring now to FIG. 3, a block diagram of one implementation of performing a retiming synthesis on a logic design 310 is shown. Logic design 310 is representative of a collection of circuitry that is in the process of being synthesized into an actual, physical integrated circuit or a portion thereof. For example, in one implementation, logic design 310 is synthesized from a register-transfer level (RTL) description to form control logic 105 (of FIG. 1). As shown in FIG. 3, logic design 310 includes logic 315 and registers 320. In one implementation, registers 320 are implemented using clock-edge-triggered latches. Registers 320 can also be referred to as flip-flops 320. As shown in logic design 310, logic 315 is organized together into a single unit on the left side of logic design 310 while registers 320 are grouped together on the right side of logic design 310. In one implementation, a retiming synthesis is performed to pipeline logic design 310 to allow for the clock frequency that runs logic design 310 to be increased.

Accordingly, in one implementation, after the retiming synthesis is performed, logic design 310 is converted into a pipelined version which is shown at the bottom of FIG. 3 as logic design 330. In contrast with logic design 310, logic design 330 has multiple smaller chunks of logic 335A-G as well as registers 340A-F which are spread out throughout the chunks of logic 335A-G. This allows the logic design 330 to be pipelined and for each register 340A-F to be clocked with a relatively high frequency clock, especially when compared to the clock frequency which would be possible for logic design 310. However, while the clock frequency can be increased for logic design 330 as compared to logic design 310, there are additional improvements that can be made to logic design 330 to reduce its power consumption. Techniques for making these improvements will be described in further detail throughout the remainder of this disclosure.

Figure 4:
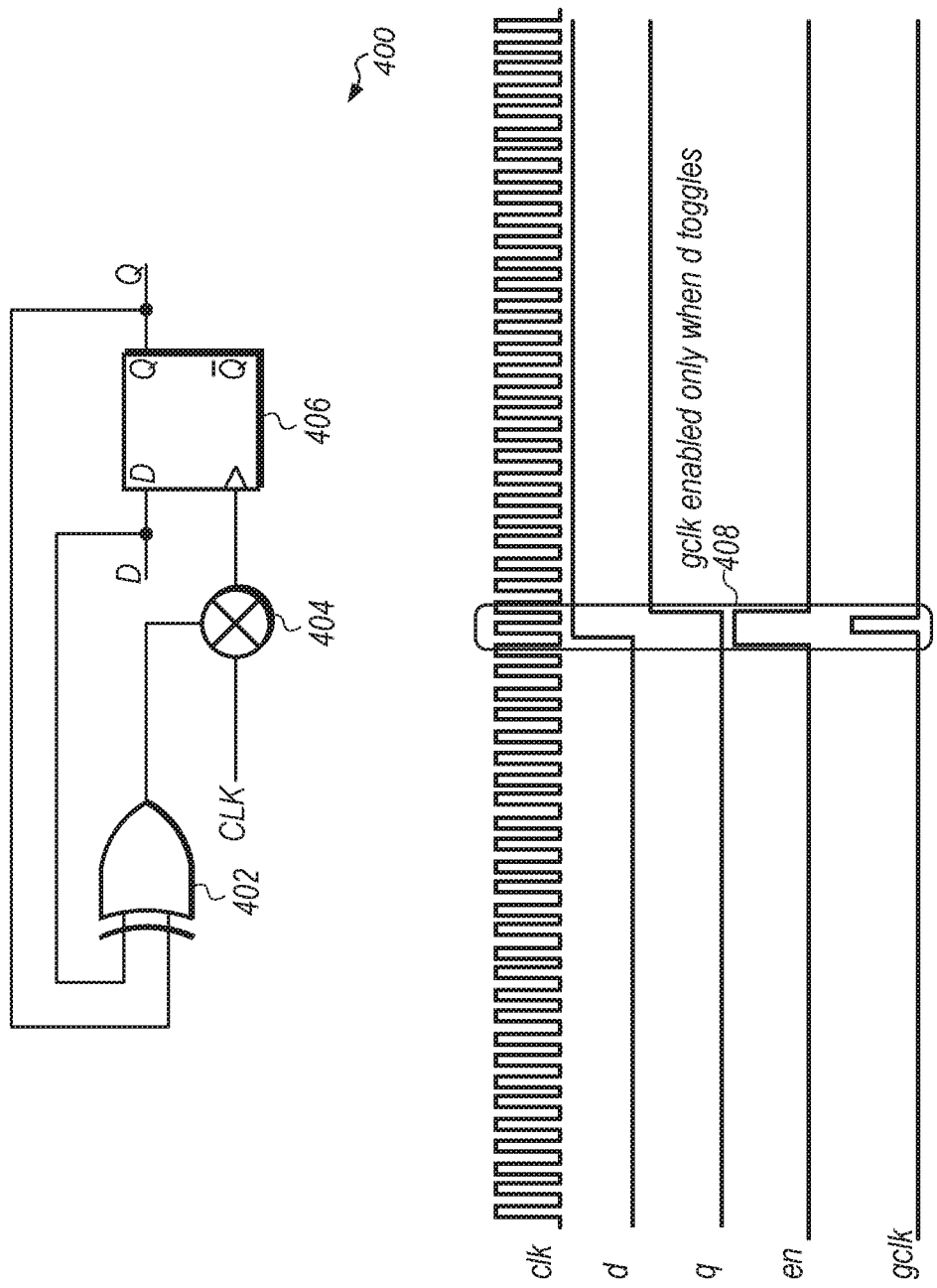
FIG. 4 is a block diagram of one implementation of a self-gating circuit.

Turning now to FIG. 4, a block diagram of one implementation of a self-gating circuit 400 is shown. In one implementation, power is reduced in a circuit 400 with a register 406 by self-gating the clock input. Self-gating refers to only enabling the clock signal that is coupled to the clock input port of a register 406 if the input signal changes. As shown in circuit 400, the input to register 406 is coupled to one input of XOR gate 402. The output of register 406 is coupled to the other input of XOR gate 402. Accordingly, the output of XOR gate 402 will be high only when the input is different from the output of register 406. The output of XOR gate 402 feeds the enable gate 404 which passes the clock signal through to register 406 only when the output of XOR gate 402 is high.

The waveforms at the bottom of FIG. 4 illustrate how the gclk signal coupled to register 406 is only enabled when the input signal "d" toggles. The enable signal going high is shown in highlighted portion 408 when the input signal "d" goes from low to high. The clock signal is shown at the top row of the waveforms, and the clock signal is continually toggling but the gclk signal only toggles when the input signal "d" toggles. By implementing the self-gating circuit 400, the power consumed by register 406 is reduced since the register 406 will only be clocked when its input value changes. However, there is an increase in the amount of logic used to implement the self-gating circuit 400 which increases the total area of circuit 400. Accordingly, techniques for reducing power consumption while minimizing the increase in circuit area required to achieve this reduced power consumption are desired.

Figure 5:
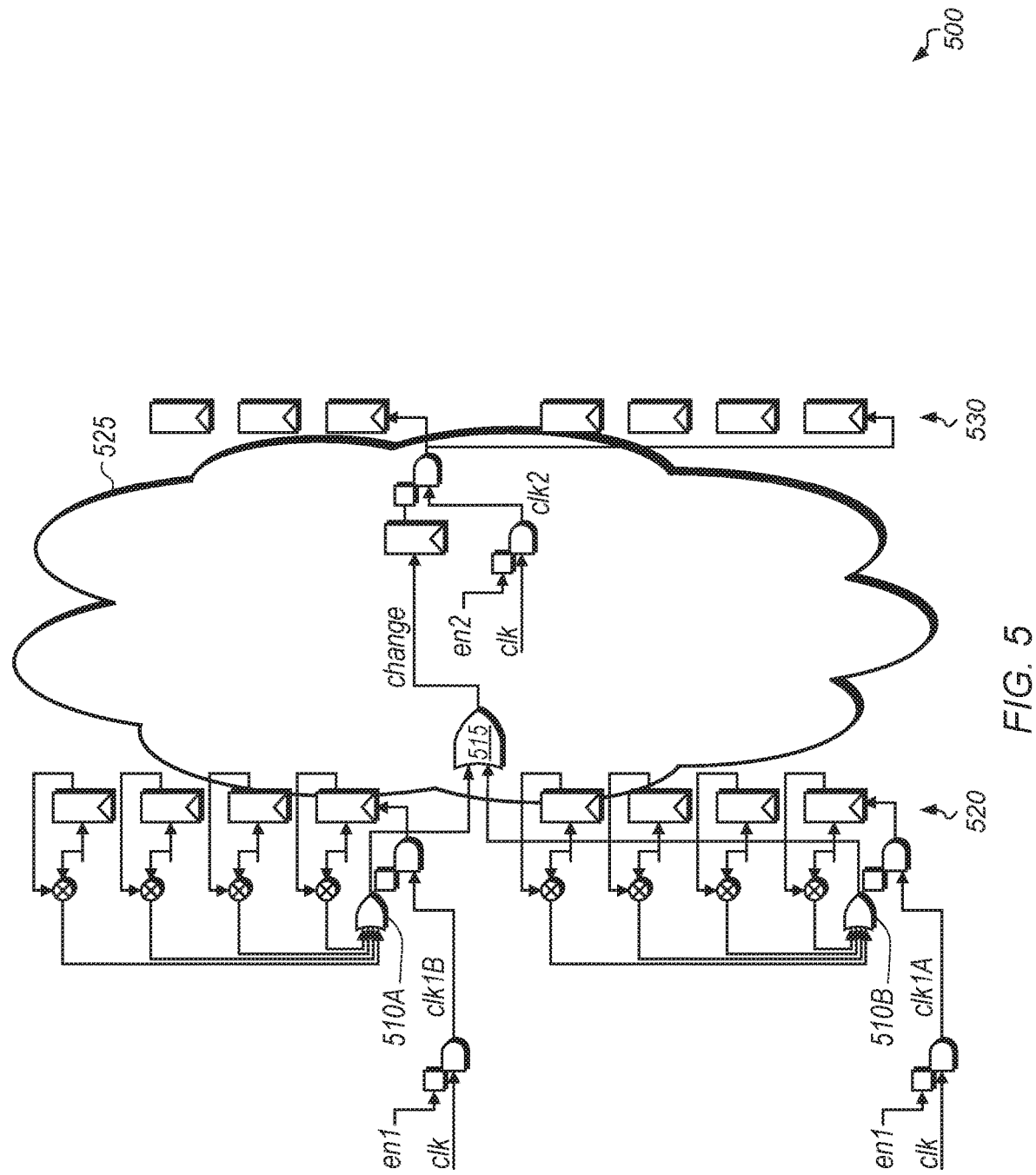
FIG. 5 is a block diagram of a circuit design which includes logic and routing for forwarding a change signal between stages.

Referring now to FIG. 5, a block diagram of a circuit design 500 which includes logic and routing for forwarding a change signal between stages is shown. In one implementation, circuit 500 includes combinatorial logic 505 in between a first stage 520 of registers and a second stage 530 of registers. Rather than self-gating both stages 520 and 530, only the first stage 520 is self-gated. As previously described, self-gating is implemented by taking the output of a register and coupling it back to an XOR gate while also coupling the input of the register to the same XOR gate. The output of the XOR gate is the enable signal for the clock input which only lets the clock input through to the clock port of the corresponding register if the input signal toggles. This self-gating technique is illustrated in circuit 400 (of FIG. 4). The same technique shown in circuit 400 is used for each register of stage 520.

In one implementation, there is an OR-gate 510A for the upper registers of stage 520 and an OR-gate 510B for the lower registers of stage 520. Any number of OR-gates can be implemented to combine the enable signals from each of the registers of stage 520. The outputs of OR-gates 510A and 510B are coupled to the inputs of OR-gate 515. While two levels of OR-gates are shown in FIG. 5, it should be understood that other implementations can use other numbers of levels of OR-gates. The output of OR-gate 515 is referred to as a "change detect signal" or a "change signal", and the change signal is clocked (i.e., delayed) and then coupled through to provide the clock enable signal for the registers of the second stage 530. By coupling the change signal from the first stage 520 to the second stage 530, the second stage 530 benefits from power savings without having to implement self-gating circuitry for the individual registers of the second stage 530. In one implementation, circuit 500 is partitioned into a stripe which includes stages 520 and 530 based on an analysis of a netlist level representation of circuit 500. In one implementation, this partitioning of circuit 500 into stages 520 and 530 is performed by a script operating on the netlist level representation of circuit 500. The partitioning of a circuit into stages will be described in more detail in the description of method 800 (of FIG. 8).

Figure 6:
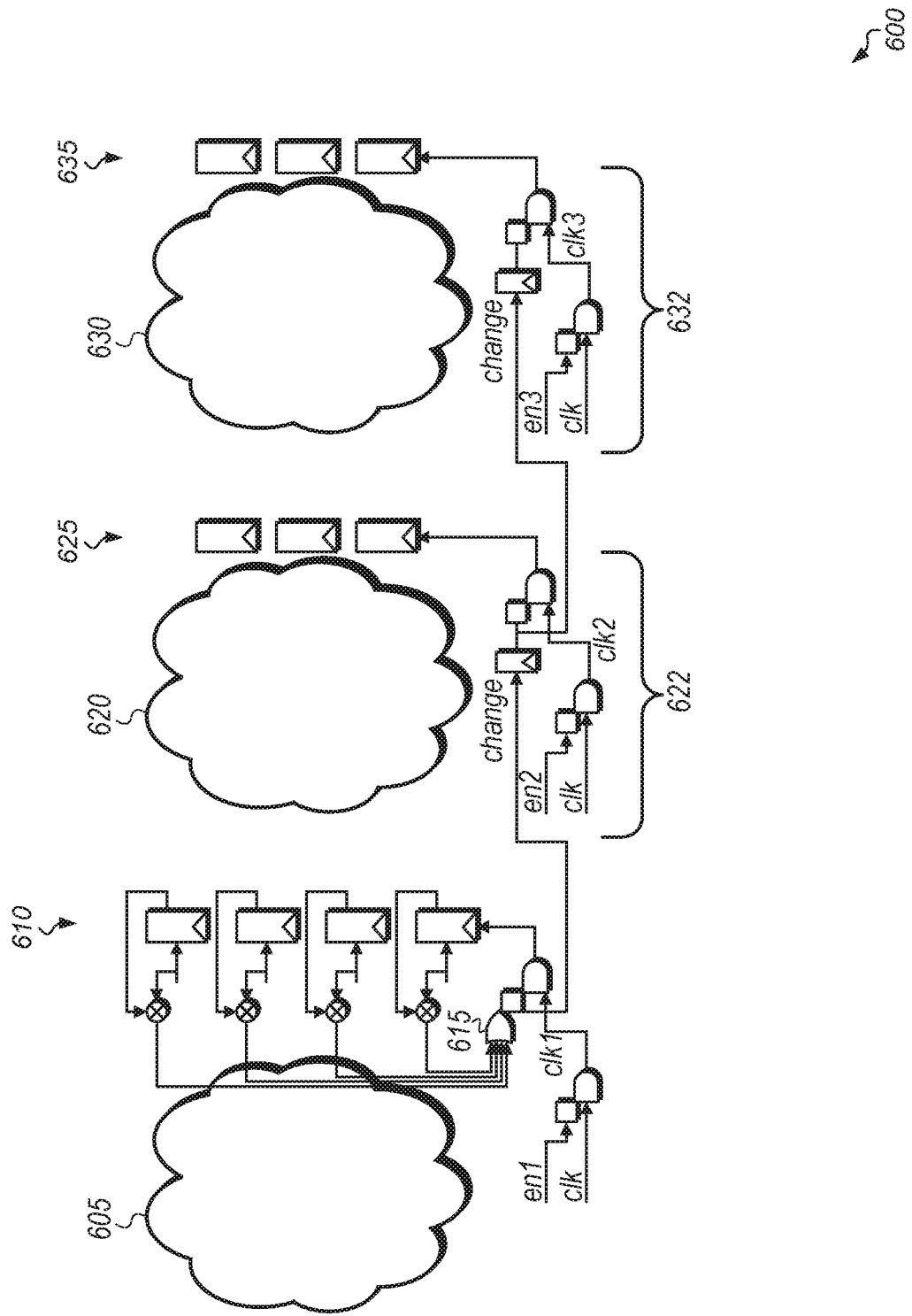
FIG. 6 is a block diagram of one implementation of a circuit design with multiple stages.

Turning now to FIG. 6, a block diagram of one implementation of a circuit design 600 with multiple stages is shown. In one implementation, circuit 600 includes logic 605 followed by register stage 610 which is coupled to logic 620. Register stage 610 includes self-gating circuitry, and the self-gating signals are coupled to OR-gate 615 to generate a change signal. Logic 620 is followed by register stage 625 which is coupled to logic 630, and logic 630 is followed by register stage 635. It is noted that logic 605, 620, and 630 can include any number and arrangement of combinatorial gates and other circuitry in any suitable organization which varies depending on the functional requirements of circuit design 600. In other implementations, circuit design 600 can include other numbers of stages.

In one implementation, a change signal is forwarded to multiple stages after a first stage of registers 610. For example, a change signal generated by OR-gate 615 from the self-gating circuitry of first stage 610 is forwarded to second stage 625. The change signal is clocked and provided to logic 622 to generate the clock enable signal for second stage 625. Then, this delayed version of the change signal is clocked and provided to logic 632 to generate the clock enable signal for third stage 635. It is noted that the change signal could also be provided to any number of additional stages after third stage 635.

Figure 7:
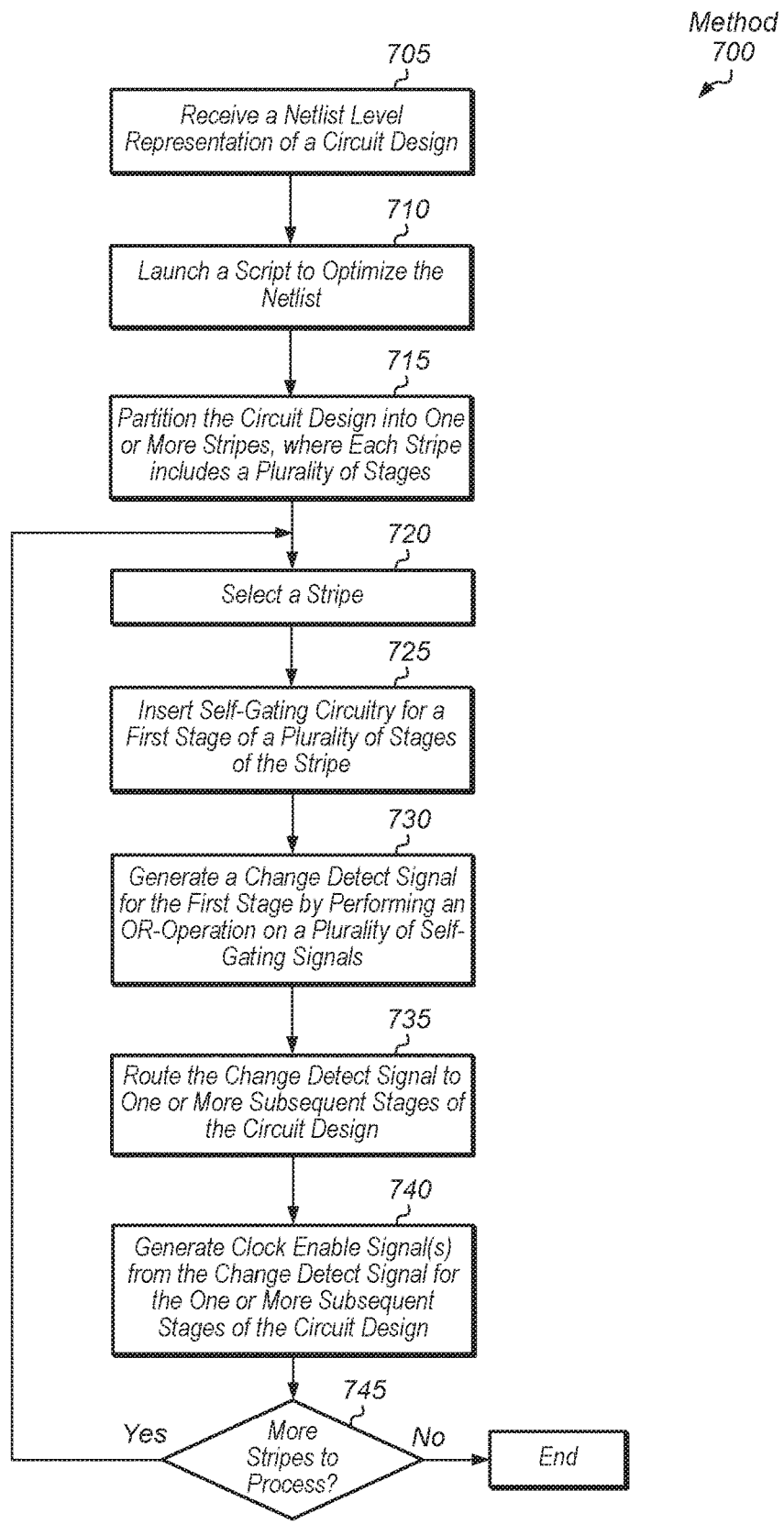
FIG. 7 is a generalized flow diagram illustrating one implementation of a method for organizing logic and routing paths in an efficient manner in a retiming pipeline.
Figure 8:
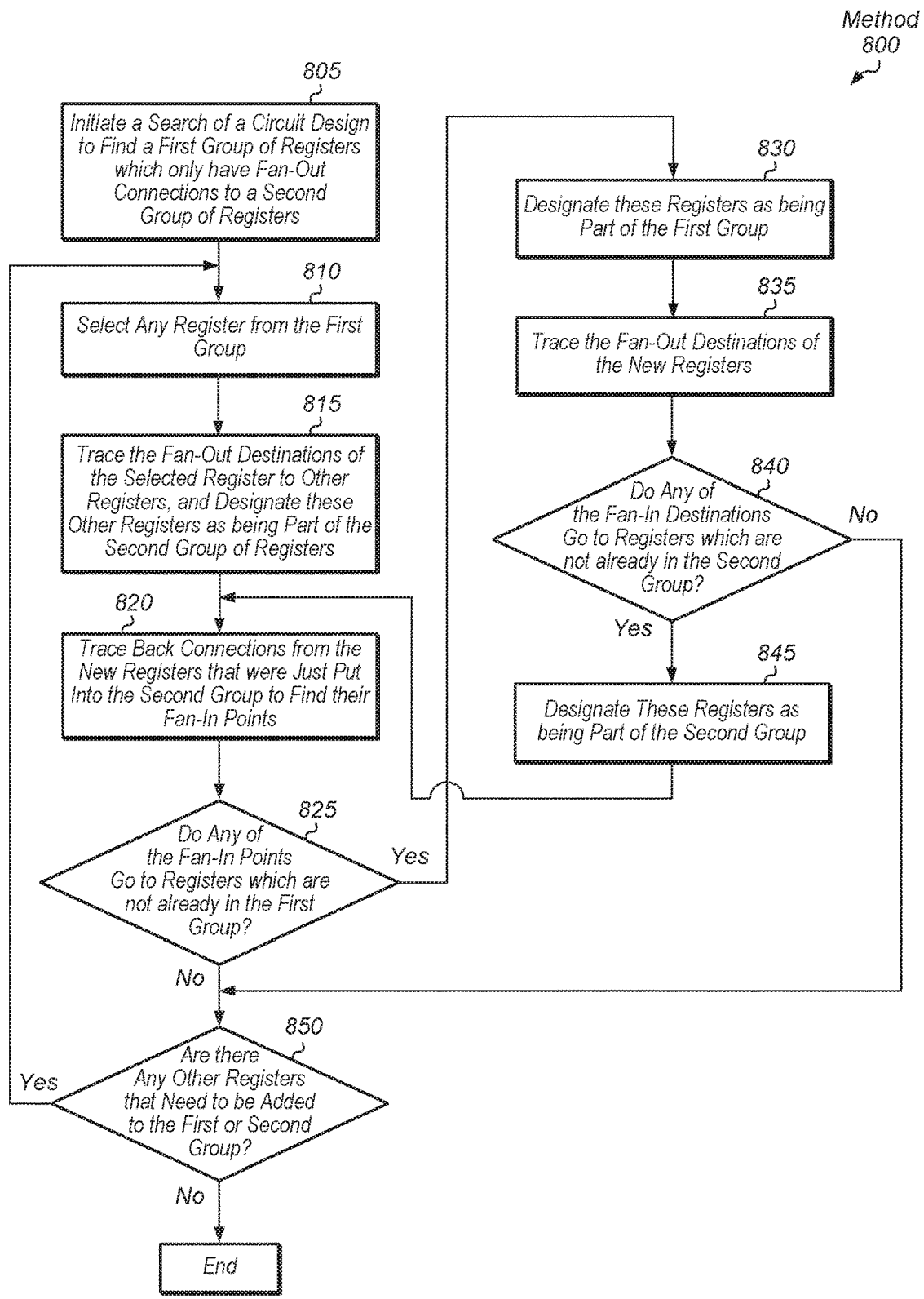
FIG. 8 is a generalized flow diagram illustrating one implementation of a method for identifying a stripe within a circuit design.
Figure 9:
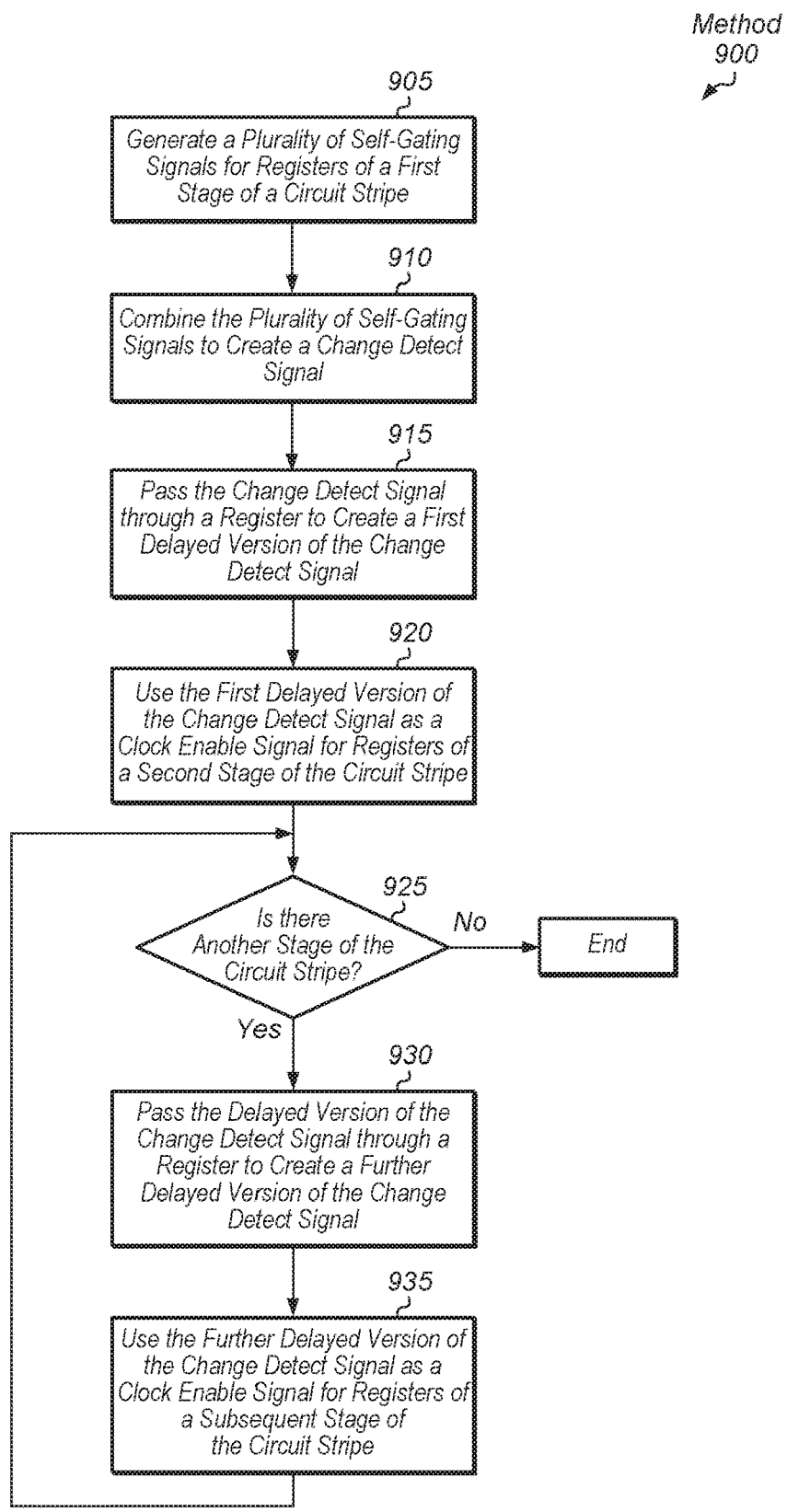
FIG. 9 is a generalized flow diagram illustrating one implementation of a method for generating clock enable signals for the stages of a circuit stripe.

Referring now to FIG. 7, one implementation of a method 700 for organizing logic and routing paths in an efficient manner in a retiming pipeline is shown. For purposes of discussion, the steps in this implementation and those of FIG. 8-9 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 700.

A design tool receives a netlist level representation of a circuit design (block 705). The design tool can include any suitable combination of software and/or hardware. In other implementations, the design tool receives other representations (e.g., RTL) of the circuit design. The design tool launches a script to optimize the netlist (block 710). The script executes on one or more processors of a computing device or system to partition the circuit design into one or more stripes, where each stripe includes a plurality of stages (block 715). One example of a technique for performing block 715 is described in further detail in the discussion of method 800 (of FIG. 8). Next, the script selects a stripe (block 720). Then, the script inserts self-gating circuitry for a first stage of a plurality of stages of the stripe (block 725). Next, the script inserts circuitry to generate a change detect signal for the first stage by performing an OR-operation on a plurality of self-gating signals (block 730). If the first stage only has a single register, then there is only a single self-gating signal, and the OR-operation can be skipped. Then, the script routes the change detect signal to one or more subsequent stages of the circuit design (block 735). It is noted that the change detect signal is delayed for each subsequent stage to which it is routed.

Next, the script generates clock enable signal(s) from the change detect signal for the one or more subsequent stages of the circuit design (block 740). The clock enable signal causes the clock to be enabled for the subsequent stages only when the change detect signal indicates that a change was detected at the first stage of the logic design. If there are more stripes to process (conditional block 745, "yes" leg), then method 700 returns to block 720. Otherwise, if there are no more stripes to process (conditional block 745, "no" leg), then method 700 ends.

Turning now to FIG. 8, one implementation of a method 800 for identifying a stripe within a circuit design is shown. A search of a circuit design is initiated to find a first group of registers which only have fan-out connections to a second group of registers (block 805). In other words, the first group of registers do not have any output connections to registers outside of the second group. In one implementation, the search is performed within a netlist representation of the circuit design. In other implementations, the search is performed of other representations of the circuit design. In one implementation, the search is performed by a script executing on a computing system. In other implementations, other software and/or hardware, or any combination thereof, initiates the search in block 805. It is noted that the "first group" can also be referred to herein as a "first stage", and the "second group" can also be referred to herein as a "second stage".

Any register from the first group is selected (block 810). The fan-out destinations of the selected register are traced to other registers, and these other registers are designated as being part of the second group of registers (block 815). The term "fan-out destination" refers to a register whose input port is driven (either directly or indirectly) by the signal generated at the output port of the selected register.

Next, connections from the new registers that were just put into the second group are traced back to find their fan-in points (block 820). In other words, the starting points of the signals coupled to these new registers are determined in block 820. If any of the fan-in points go to registers which are not already in the first group (conditional block 825, "yes" leg), then these registers are designated as being part of the first group (block 830). Then, the fan-out destinations of the new registers are traced (block 835). If any of the fanout destinations of the new registers are not already in the second group (conditional block 840, "yes" leg), then these registers are designated as being part of the second group (block 845). After block 845, method 800 returns to block 820 to trace back connections from the new registers put into the second group to their fan-in points.

If the fan-in points are already in the first group (conditional block 825, "no" leg), then it is determined if there are any other registers that need to be added to the first group or the second group (conditional block 850). If there are any other registers that need to be added to the first group or the second group (conditional block 850, "yes" leg), then method 800 returns to block 810. If there are no other registers that need to be added to the first group or the second group (conditional block 850, "no" leg), then method 800 ends. If the fan-out destinations of the new registers are already in the second group (conditional block 840, "no" leg), then method 800 jumps to conditional block 850.

In one implementation, at the end of method 800, if the number of registers in the first group is less than a first threshold and/or if the number of registers in the second group is less than a second threshold, then the combination of the first and second group are designated as a stripe. As a result of the first and second group being designated as a stripe, the self-gating signals of the first group are combined to create a change detect signal which is provided to the second group. Otherwise, in this implementation, if the number of registers in the first group is greater than or equal to the first threshold and/or if the number of registers in the second group is greater than or equal to the second threshold, then the first group and the second group are not designated as a stripe. In other implementations, other techniques for determining whether the combination of the first and second group constitute a stripe are possible and are contemplated. Additionally, in some implementations, a change detection signal is generated and propagated for a stripe only if a toggle rate of registers in the second group is predicted to be less than a threshold. For example, in one implementation, tests can be performed to determine the predicted toggle rates of the various registers in the circuit design. In one implementation, the first and second thresholds are adjusted based on the predicted toggle rates of the registers of the second group. For example, if the predicted toggle rate of the registers of the second group are relatively low, then the first and second thresholds are increased. For example, if the registers of a given second group change infrequently, then even if there are relatively large numbers of registers in the first and/or second group, it could still be advantageous to designate the first and second groups as a stripe and add the change detect signal propagation circuitry and routing to reduce power consumption.

Referring now to FIG. 9, one implementation of a method 900 for generating clock enable signals for the stages of a circuit stripe is shown. A plurality of self-gating signals are generated for registers of a first stage of a circuit stripe (block 905). It is assumed for the purposes of this discussion that a circuit design was previously partitioned into a plurality of stripes. The plurality of self-gating signals are combined to create a change detect signal (block 910). In one implementation, the plurality of self-gating signals are combined using an OR-gate. In some implementations, a plurality of OR-gates are used to combine the plurality of self-gating signals together to create the change detect signal.

Next, the change detect signal is passed through a register to create a first delayed version of the change detect signal (block 915). Then, the first delayed version of the change detect signal is used as a clock enable signal for registers of a second stage of the circuit stripe (block 920). If there is another stage of the circuit stripe (conditional block 925, "yes" leg), then the delayed version of the change detect signal is passed through a register to create a further delayed version of the change detect signal (block 930). Then, the further delayed version of the change detect signal is used as a clock enable signal for registers of a subsequent stage of the circuit stripe (block 935). For example, in one implementation, a second delayed version of the change detect signal is used as a clock enable signal for registers of a second stage of the circuit stripe, a third delayed version of the change detect signal is used as a clock enable signal for registers of a third stage of the circuit stripe, and so on. After block 935, method 900 returns to conditional block 925. If there are no other stages of the circuit stripe (conditional block 925, "no" leg), then method 900 ends. It is noted that method 900 can be performed for each stripe of the overall circuit design.

In various implementations, program instructions of a software application are used to implement the methods and/or mechanisms described herein. For example, program instructions executable by a general or special purpose processor are contemplated. In various implementations, such program instructions can be represented by a high level programming language. In other implementations, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (HDL) such as Verilog can be used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   a plurality of registers in a first stage; and
   a plurality of registers in a second stage;
   wherein the circuit is configured to:
      generate a change detect signal from a plurality of self-gating signals corresponding to the plurality of registers in the first stage;
      pass the change detect signal through a first register to create a first delayed version of the change detect signal;
      generate a first clock enable signal from the first delayed version of the change detect signal; and
      supply a clock to the plurality of registers in the second stage only when the first clock enable signal is enabled.

2. The circuit as recited in claim 1, wherein a number of registers in the first stage is less than a first threshold, and wherein a number of registers in the second stage is less than a second threshold.

3. The circuit as recited in claim 1, wherein a toggle rate of the plurality of registers in the second stage is predicted to be less than a threshold.

4. The circuit as recited in claim 1, wherein the circuit further comprises a plurality of registers in a third stage of the circuit stripe, wherein the circuit is further configured to:
   pass the first delayed version of the change detect signal through a second register to create a second delayed version of the change detect signal;

generate a second clock enable signal from the second delayed version of the change detect signal; and supply a clock to the plurality of registers in the third stage only when the second clock enable signal is enabled.

5. The circuit as recited in claim 1, wherein fan-out destinations of the first stage go only to the second stage, and wherein fan-in connections of the second stage are only found in the first stage.

6. The circuit as recited in claim 1, wherein the change detect signal is generated by passing the plurality of self-gating signals through one or more levels of OR-gates.

7. The circuit as recited in claim 1, wherein the second stage does not include any self-gating circuitry, and wherein only the first stage includes self-gating circuitry.

8. A method comprising:
   generating a change detect signal from a plurality of self-gating signals corresponding to a plurality of registers in the first stage;
   passing the change detect signal through a first register to create a first delayed version of the change detect signal;
   generating a first clock enable signal from the first delayed version of the change detect signal; and
   supplying a clock to a plurality of registers in a second stage only when the first clock enable signal is enabled.

9. The method as recited in claim 8, wherein a number of registers in the first stage is less than a first threshold, and wherein a number of registers in the second stage is less than a second threshold.

10. The method as recited in claim 8, wherein a toggle rate of the plurality of registers in the second stage is predicted to be less than a threshold.

11. The method as recited in claim 8, further comprising:
    passing the first delayed version of the change detect signal through a second register to create a second delayed version of the change detect signal;
    generating a second clock enable signal from the second delayed version of the change detect signal; and
    supplying a clock to a plurality of registers in a third stage only when the second clock enable signal is enabled.

12. The method as recited in claim 8, wherein fan-out destinations of the first stage go only to the second stage, and wherein fan-in connections of the second stage are only found in the first stage.

13. The method as recited in claim 8, wherein the change detect signal is generated by passing the plurality of self-gating signals through one or more levels of OR-gates.

14. The method as recited in claim 8, wherein the second stage does not include any self-gating circuitry, and wherein only the first stage includes self-gating circuitry.

15. A system comprising:
    a memory storing program instructions;
    a processor coupled to the memory; and
    control logic coupled to the processor, wherein the control logic is configured to:
       generate a change detect signal from a plurality of self-gating signals corresponding to a plurality of registers in a first stage;
       pass the change detect signal through a first register to create a first delayed version of the change detect signal;
       generate a first clock enable signal from the first delayed version of the change detect signal; and
       supply a clock to a plurality of registers in a second stage only when the first clock enable signal is enabled.

16. The system as recited in claim 15, wherein a number of registers in the first stage is less than a first threshold, and wherein a number of registers in the second stage is less than a second threshold.

17. The system as recited in claim 15, wherein a toggle rate of the plurality of registers in the second stage is predicted to be less than a threshold.

18. The system as recited in claim 15, wherein the control logic is further configured to:
    pass the first delayed version of the change detect signal through a second register to create a second delayed version of the change detect signal;
    generate a second clock enable signal from the second delayed version of the change detect signal; and
    supply a clock to a plurality of registers in a third stage only when the second clock enable signal is enabled.

19. The system as recited in claim 15, wherein fan-out destinations of the first stage go only to the second stage, and wherein fan-in connections of the second stage are only found in the first stage.

20. The system as recited in claim 15, wherein the second stage does not include any self-gating circuitry, and wherein only the first stage includes self-gating circuitry.

* * * * *